United States Patent
Kashyap et al.

(10) Patent No.: US 10,890,553 B2
(45) Date of Patent: Jan. 12, 2021

(54) SENSING DEVICE, SENSING APPARATUS AND SENSING SYSTEM

(71) Applicant: EPISTAR CORPORATION, Hsinchu (TW)

(72) Inventors: Kunal Kashyap, Hsinchu (TW);
Kun-Wei Kao, Hsinchu (TW);
Yih-Hua Renn, Hsinchu (TW);
Meng-Lun Tsai, Hsinchu (TW);
Zong-Xi Chen, Hsinchu (TW);
Hsin-Mao Liu, Hsinchu (TW);
Jui-Hung Yeh, Hsinchu (TW);
Hung-Chi Wang, Hsinchu (TW)

(73) Assignee: EPISTAR CORPORATION, Hsinchu (TW)

(*) Notice: Subject to any disclaimer, the term of this patent is extended or adjusted under 35 U.S.C. 154(b) by 77 days.

(21) Appl. No.: 15/804,455

(22) Filed: Nov. 6, 2017

(65) Prior Publication Data

US 2018/0128761 A1    May 10, 2018

Related U.S. Application Data

(60) Provisional application No. 62/497,108, filed on Nov. 7, 2016.

(51) Int. Cl.
| | | |
|---|---|---|
| *G01N 27/414* | (2006.01) | |
| *H01L 29/778* | (2006.01) | |
| *H01L 23/34* | (2006.01) | |
| *G01N 27/02* | (2006.01) | |
| *H01L 29/20* | (2006.01) | |
| *H01L 29/205* | (2006.01) | |
| *H01L 29/10* | (2006.01) | |
| *H01L 23/31* | (2006.01) | |

(52) U.S. Cl.
CPC ........... *G01N 27/414* (2013.01); *G01N 27/02* (2013.01); *G01N 27/4141* (2013.01); *H01L 23/345* (2013.01); *H01L 29/2003* (2013.01); *H01L 29/205* (2013.01); *H01L 29/7787* (2013.01); *H01L 23/3171* (2013.01); *H01L 29/1029* (2013.01); *H01L 29/7786* (2013.01)

(58) Field of Classification Search
CPC .. G01N 27/414; G01N 27/4141; G01N 27/02; H01L 29/205; H01L 29/2003; H01L 23/345; H01L 29/7787; H01L 23/3171; H01L 29/7786; H01L 29/1029
See application file for complete search history.

(56) References Cited

U.S. PATENT DOCUMENTS

| | | |
|---|---|---|
| 5,003,812 A | 4/1991 | Yagawara et al. |
| 5,605,612 A | 2/1997 | Park et al. |
| 6,928,878 B1 * | 8/2005 | Eriksen ................. G01L 9/0042 73/724 |
| 7,157,054 B2 | 1/2007 | Toyoda et al. |

(Continued)

*Primary Examiner* — Edward Chin
(74) *Attorney, Agent, or Firm* — Patterson + Sheridan, LLP

(57) ABSTRACT

A sensing device includes a first III-V compound stack and a second III-V compound stack. The first III-V compound stack has a first sensing area, and the second III-V compound stack has a second sensing area. A passivation layer fully covers the second sensing area. The first III-V compound stack is physically separated from the second III-V compound stack, and has material compositions and structures same as the second III-V compound stack.

6 Claims, 11 Drawing Sheets

(56) References Cited

U.S. PATENT DOCUMENTS

| | | | | |
|---|---|---|---|---|
| 7,827,852 | B2* | 11/2010 | Cui | G01N 27/125 73/31.06 |
| 8,884,382 | B2* | 11/2014 | Stetter | G01N 27/00 257/414 |
| 2002/0031854 | A1* | 3/2002 | Walker | G01N 27/414 438/49 |
| 2003/0183520 | A1* | 10/2003 | Mabuchi | G01N 27/4072 204/424 |
| 2004/0026268 | A1* | 2/2004 | Maki | G01N 27/4071 205/784 |
| 2011/0088456 | A1 | 4/2011 | Ren et al. | |
| 2011/0169056 | A1* | 7/2011 | Wey | H01L 29/4958 257/253 |
| 2012/0292727 | A1* | 11/2012 | Huang | H01L 27/14645 257/432 |
| 2018/0219087 | A1* | 8/2018 | Dasgupta | H01L 21/0254 |

* cited by examiner

SENSING DEVICE, SENSING APPARATUS AND SENSING SYSTEM

This application claims the benefit of U.S. provisional application Ser. No. 62/497,108, filed on Nov. 7, 2016, the disclosure of which is incorporated herein by reference herein in its entirety.

TECHNICAL FIELD

The disclosure relates in general to a sensing device, and more particularly to a sensing device having a reference element for sensing the noise or the base line shift.

BACKGROUND

A commercial sensor shows some kind of shift in its base line signal, which is called "base line shift". The base line shift is not caused by the target substance, and is unwanted. The base line shift may arise from many factors such as temperature change due to wind flow, heater material decay after long term use, or the sensitive material decay due to long term use. The system implementation, due to base line shift, becomes difficult and needs a conditioning of the sensor in some interval of use. This would increase the cost and maintenance efforts. There is some kind of IC implementation in a system which can store a long term data and keep changing of the base line after some periods of time. This implementation needs to keep track of temperature change which needs another set of temperature sensor ending up again increasing the cost.

SUMMARY

A sensing device includes a first III-V compound stack and a second III-V compound stack. The first III-V compound stack has a first sensing area, and the second III-V compound stack has a second sensing area. A passivation layer fully covers the second sensing area. The first III-V compound stack is physically separated from the second III-V compound stack, and has material compositions and structures same as the second III-V compound stack.

Figure 1A:
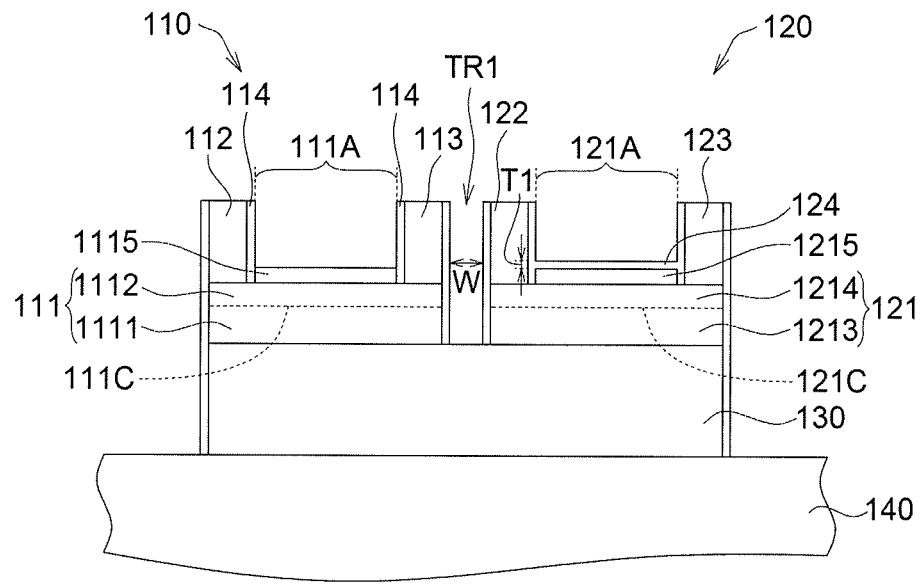
FIG. 1A shows a cross-sectional view of a sensing device according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed.

Please refer to FIG. 1A, which shows a cross-sectional view of a sensing device 100 according to one embodiment. The sensing device 100 shown in FIG. 1A includes a sensing element 110, a reference element 120, a substrate 130 and a heater 140. The sensing device 100 can be integrated with other circuit(s) and/or component(s) into a single substrate which is sometimes called an SOC (system on chip).

The sensing element 110 includes a first III-V compound stack 111, two electrodes 112, 113 and a passivation layer 114. The reference element 120 includes a second III-V compound stack 121, a passivation layer 124, and two electrodes 122, 123. The sensing element 110 and the reference element 120 can be the field effect transistors, MOSFET, MESFET, schottky diode, and HEMT. The electrodes 112, 113 are a source electrode and a drain electrode for power input, and a first sensing area 111A located between the electrode 112 and the electrode 113 is a region as functioned for sensing target substance, such as $H_2$, $NH_3$, CO, $SO_X$, NO, $NO_2$, $CO_2$, $CH_4$, acetone, ethanol, formaldehyde, and benzene. The target substance can exist in the form of gas or liquid. The passivation layer 114 covers the lateral surface of the electrodes 112, 113, and the lateral surface of first III-V compound stack 111, and exposes the first sensing area 111A. The electrodes 122, 123 are a source electrode and a drain electrode for power input, and a second sensing area 121A located between the electrode 122 and the electrode 123 is a region fully covered by the passivation layer 124 and isolated from the outside. The passivation layer 124 covers the lateral surface of the electrodes 122, 123, and the lateral surface of the second III-V compound stack 121; and the passivation layer 124 does not expose the second sensing area 121A.

In one embodiment, the sensing element 110 and the reference element 120 are made of group III or V material which can be fabricated from an epitaxial growth process. In other embodiment, either the sensing element 110 or the reference element 120 is a HEMT device with a channel (2DEG) formed of AlGaN/GaN on the substrate 130. HEMT structures can be used in a microwave power amplifier as well as a gas or liquid sensing device because of their high two-dimensional electron gas (2DEG) mobility and saturation velocity. In other embodiment, the sensing element 110 or the reference element 120 may be selected from the group consisting of a metal-oxide-semiconductor FET (MOSFET), a metal-semiconductor FETs (MESFETs), and a high electron mobility transistor (HEMT).

As shown in FIG. 1A, a first 2DEG channel 111C of the first III-V compound stack 111 is physically separated from a second 2DEG channel 121C of the second III-V compound stack 121. The first III-V compound stack 111 and the second Ill-V compound stack 121 are physically separated by a trench TR1.

If the target substance is detected by the first sensing region 111A, the electron density in the first 2DEG channel 111C and the current in the first 2DEG channel 111C are varied according to the concentration of the target substance. The concentration of the target substance is the number of molecules of the target substance per unit volume. The current in the first 2DEG channel 111C is affected by the target substance detected by the first sensing region 111A and the background noise; the current in the second 2DEG channel 121C is only affected by the background noise because of the second sensing area 121A is isolated from the outside. Due to the trench TR1, the current in the first 2DEG channel 111C and the current in the second 2DEG channel 121C are not interfered with each other. The trench TR1 formed between the first 2DEG channel 111C and the second 2DEG channel 121C can prevent interference between the first 2DEG channel 111C and the second 2DEG channel 121C. In one embodiment, the width W of the trench TR1 is preferably greater than 30 nm. In one embodiment, the trench TR1 can be filled with an insulating material, such as $SiO_x$, silicon nitride ($SiN_x$), SiON, or $AlO_x$. In another embodiment, the trench TR1 is empty and isn't filled with a solid material.

The first III-V compound stack 111 includes a first semiconductor layer 1111 and a second semiconductor layer 1112. The sensing element 110 further includes a first functionalization layer 1115 disposed on the first sensing area 111A. In one embodiment, the first functionalization layer 1115 can be omitted. The first functionalization layer 1115 is used for enhancing the selectivity and sensitivity of detecting the target substance. The first semiconductor layer 1111 and the second semiconductor layer 1112 are made of piezoelectric materials and have different band gaps. The first 2DEG channel 111C can be formed at the interface of the first semiconductor layer 1111 and the second semiconductor layer 1112. While the sensing element 110 operates to detect the target substance, the electrodes 112, 113 are connected to the first 2DEG channel 111C in an Ohmic contact type, and the first sensing area 111A connects the first 2DEG channel 111C in Schottky contact type. If first sensing area 111A is affected by the target substance, the target substance can change the charges on the first sensing area 111A. Therefore, the net surface charge changing on the first sensing area 111A can alter the electron density in the first 2DEG channel 111C. The detecting signal caused by the first sensing area 111A can be amplified through the drain-source current. The drain-source current is varied along the change of the electron density in the first 2DEG channel 111C. In other words, the drain-source current is varied along the concentration of the target substance. Hence, the sensing element 110 is very sensitive to the target substance and the detecting signal can be easily quantified, recorded, and transmitted.

The second III-V compound stack 121 includes a third semiconductor layer 1213 and a fourth semiconductor layer 1214. The sensing element 120 further includes a second functionalization layer 1215 disposed on the second sensing area 121A and fully covered by the passivation layer 124. In one embodiment, the second functionalization layer 1215 can be omitted. The material/composition of the third semiconductor layer 1213, the material/composition of the fourth semiconductor layer 1214, and the material/composition of the second functionalization layer 1215 are respectively similar to the material/composition of the first semiconductor layer 1111, the material/composition of the second semiconductor layer 1112, and the material/composition of the first functionalization layer 1115. Due to the similar material/composition, the background noise affecting the current in the first 2DEG channel 111C and the background noise affecting the current in the second 2DEG channel 121C are similar or the same. Therefore, the background noise affecting the current in the first 2DEG channel 111C can be known according to the background noise affecting the current in the second 2DEG channel 121C.

The first III-V compound stack 111 and the second III-V compound stack 112 are epitaxially formed on the common growth substrate 130 and are disposed above the common heater 140. For example, the first III-V compound stack 111 and the second III-V compound stack 112 can be fabricated on a same wafer, and have a same or similar epitaxial structure. In other words, they have the same or similar material compositions and structures, including but not limited to material adoption, doping material and concentration, and dimensions. The second functionalization layer 1215, however, is further covered by the passivation layer 124 which can separate the target substance or other environmental medium outside the sensing device 100 from reaching the second functionalization layer 1215. The thickness T1 of the passivation layer 124 ranges from 700 Å to 1000 Å. The reference element 120, therefore, has almost the same characteristics as the sensing element 110 (i.e. background noise, base line shift and the influence of the heater 140), but is immune to the target substance.

The reference element 120 is theoretically immune to any target substance, because the second functionalization layer 1215 of the reference element 120 is physically separated from the target substance (for example: $H_2$, $NH_3$, $SO_X$, $NO_X$, $CO_X$, $CH_4$ group, acetone, or alcohol) which is detectable by the sensing element 110.

The exemplified dimensions of the sensing device 100 of one embodiment are provided below. The thickness of each of the electrode pads 112, 113, 122, 123 is about 3 um. The thickness of each of the functionalization layers 1115, 1215 is about 10-25 nm. The thickness of the passivation layer 124 is about 700-1000 Å. The thickness of each of the second semiconductor layers 1112 and the fourth semiconductor layer 1214 is about 25-35 nm. The thickness of each of the first semiconductor layer 1111, and the third semiconductor layer 1213 is about 200 nm. The thickness of the substrate 130 is about 300 um.

The exemplified materials of the sensing device 100 are provided below. The material of each of the first functionalization layers 1115 and the second functionalization layer 1215 is Pt, $SnO_2$ or Pd, gold, nickel, iridium, or metal oxide like as $SnO_2$, etc. The heater 140 is made of the material with the higher thermal conductivity, higher electrical resistivity, and lower coefficient of thermal expansion, such as Molybdenum (Mo), Polysilicon, silicon carbide, Ti, Ni, Platinum (Pt), Au, Al, Tungsten (W), $SnO_2$, alloy thereof, or combinations thereof. The material of each of the electrodes 112, 113, 122, 123 is made of one or more metallic materials, such as Au, Cu, Ti, Ni, Al, Pt, alloy thereof, or a combination thereof. The material of the passivation layer 124 is a dielectric material, such as, $SiO_2$, $SiN_x$ or polymer. The material of the substrate 130 is silicon, SiC, silicon (Si), or sapphire. The material of the combination of the second semiconductor layer 1112/the first semiconductor layer 1111 or the combination of the fourth semiconductor layer 1214/the third semiconductor layer 1213 is AlGaN/GaN, AlGaN/InGaN/GaN, A/N/GaN, A/N/InGaN/GaN, AlGaAs/GaAs, AlGaAs/InGaAs, InAlAs/InGaAs, or InGaP/GaAs.

The second semiconductor layer 1112 and the first semiconductor layer 1111 form a hetero-junction structure having the first 2DEG channel 111C. The fourth semiconductor layer 1214 and the third semiconductor layer 1213 form a hetero-junction structure having the second 2DEG channel 121C.

Figure 1B:
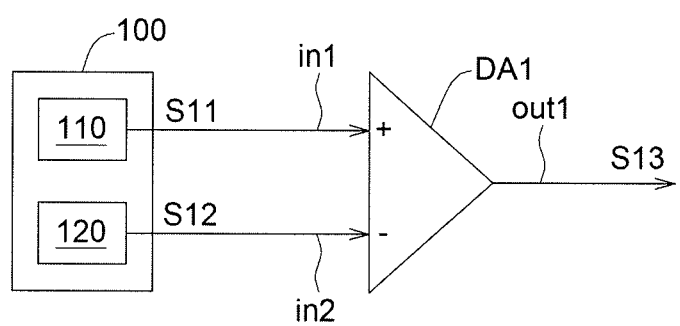
FIG. 1B shows a sensing system according to one embodiment.

Please refer to FIG. 1B, which shows a sensing system 1 according to one embodiment. The sensing system 1 includes the sensing device 100 and a differential amplifier DA1. The differential amplifier DA1 has two input terminals in1, in2 and an output terminal out1. The input terminals in1, in2 are electrically connected to the sensing element 110 (shown in FIG. 1A) and the reference element 120 (shown in FIG. 1A) for receiving a first signal S11 and a second signal S12 respectively. The output terminal out1 outputs a calibrating signal S13 by amplifying a signal which is a difference between the first signal S11 and the second signal S12. In other words, the calibrating signal S13 is a signal obtained by amplifying a signal sensed by the sensing element 110 and subtracting the background noise affecting the reference element 120. The calibrating signal S13 can be deemed as a signal which is only related to the concentration of the target substance.

Figure 2:
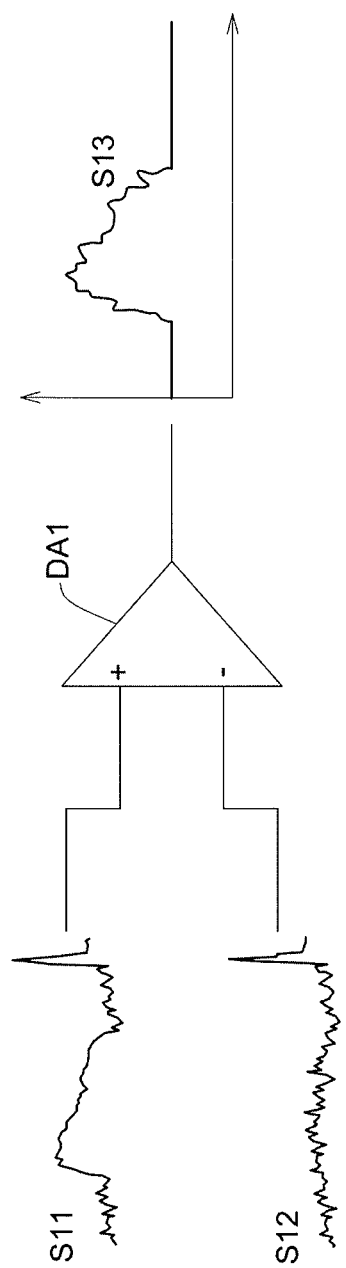
FIG. 2 shows an operation of the sensing system according to one embodiment.

Please refer to FIG. 2 which shows an operation of the sensing system according to one embodiment. The background noise is sensed, and/or the base line shift can be determined by the reference element 120 to output the second signal S12. The sensing element 110 and the reference element 120 are similar; therefore, they are affected by similar background noises, or the similar base line shifts. Because the sensing element 110 is exposed to response to existence of the target substance, the first signal S11 outputted from the sensing element 110 includes the background noise and the sensing information based on the target substance. Because the reference element 120 is not exposed, the second signal S12 outputted from the sensing element 120 only includes the background noise. The calibrating signal S13 is obtained by removing the second signal S12 from the first signal S11. Hence, the calibrating signal S13 outputted from the differential amplifier DA1 is purely directed to the concentration of the target substance.

Figure 3A:
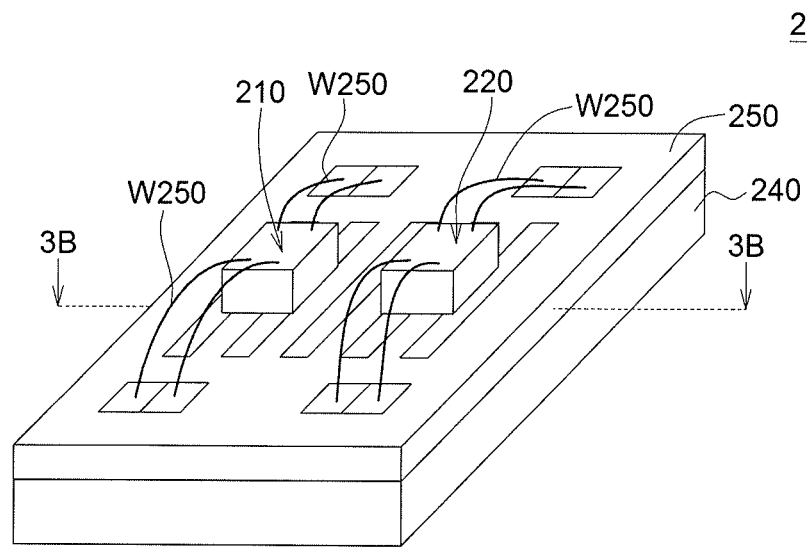
FIGS. 3A and 3B show a sensing apparatus according to another embodiment.
Figure 3B:
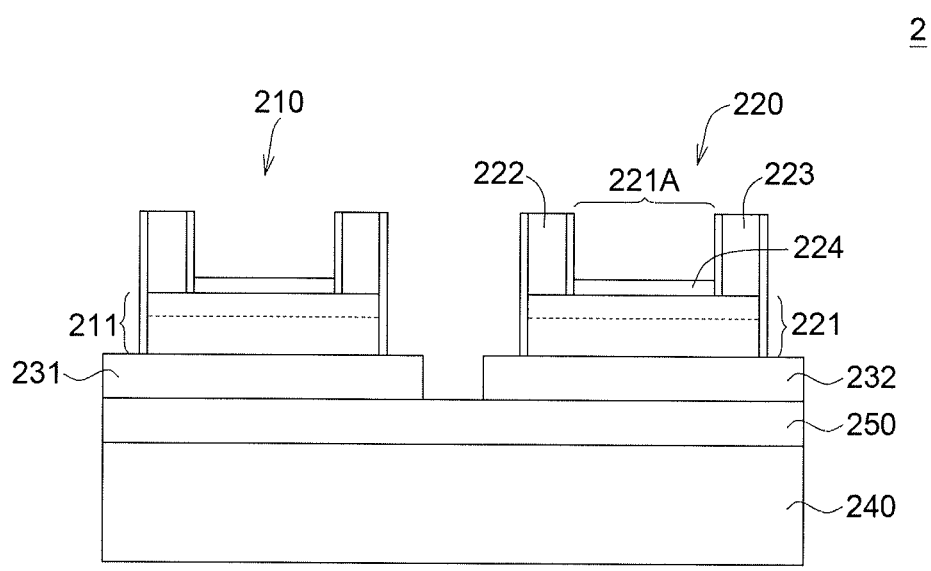

Please refer to FIGS. 3A and 3B, which show a sensing apparatus 2 according to another embodiment. In this embodiment, a sensing element 210 and a reference element 220 are disposed on a sub-mount 250, and the sub-mount 250 is disposed on a heater 240. FIG. 3B show a cross sectional view of the sensing apparatus 2 along the sectional line 3B-3B. The material of the sub-mount 250 may be Silicon, Sapphire, or Ceramic. The sensing element 210 and the reference element 220 are mounted on the sub-mount 250 and connected to the sub-mount 250 via wires W250. In another embodiment, the sensing element 210 and the reference element 220 can be flip mounted on the sub-mount 250. As shown in FIGS. 3A and 3B, the sensing element 210 and the reference element 220 are two separated elements. Specifically, the sensing element 210 and the reference element 220 are not dwelled on a common growth substrate, but have distinguished substrates 231, 232 which are separated from each other. The sensing element 210 and the reference element 220 are placed on the sub-mount 250, and electrically connected to a differential amplifier (not shown). The reference element 220 and the sensing element 210 can have the same materials with the same doping concentration, and are grown on the same (common) wafer with the same epitaxial growth condition. The reference element 210 has an additional process which is forming the passivation layer 224 on the sensing area 221A between two electrodes 222, 223. Hence, the only difference between the sensing element 210 and the reference element 220 is the passivation layer. Therefore, even if the reference element 220 is separated from the sensing element 210, the sensing element 210 and the reference element 220 have similar electrical characteristics.

The sensing element 210 and the reference element 220 can be fabricated in a way as described in the aforementioned paragraphs directed to FIG. 1A. The sensing element 210 and the reference element 220 can be manufactured on the same wafer during the same processes and fully singulated into two separated elements. The position of the sensing element 210 on the wafer is near to that of the reference element 220. Therefore, the difference of the epitaxial quality between the reference element 220 and the sensing element 210 is small.

In one embodiment, the sensing element 210 and the reference element 220 can be provided in bare chip forms, that is, they are not packaged.

In another embodiment, in order to reduce the thermal path between the heater and the sensing element, the heater (not shown) is disposed on the same side of the sub-mount 250 as the sensing element 210 and the reference element 220 such that the heating period can be reduced and the power consumption can be saved. In another embodiment, the heater (not shown) is disposed between the sensing element 210/reference element 220 and the sub-mount 250 such that the heating period can be reduced and the power consumption can be saved.

Figure 4:
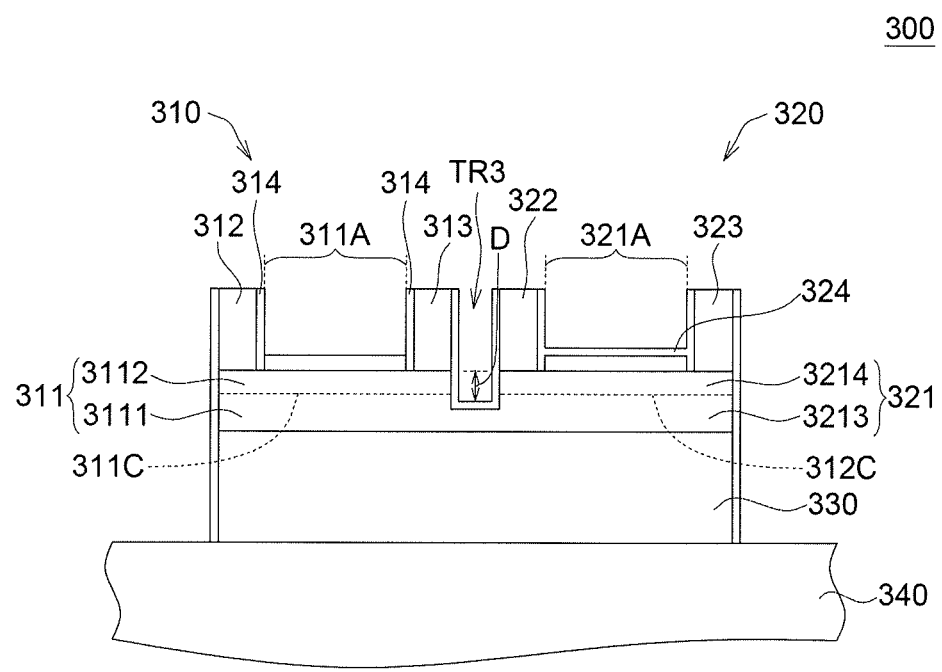
FIG. 4 shows a sensing device according to another embodiment.

Please refer to FIG. 4, which shows a sensing device 300 according to another embodiment. The sensing device includes a sensing element 310 with a first III-V compound stack 311 and a reference element 320 with a second III-V compound stack 321 formed on a common heater 340. The first III-V compound stack 311 including the first semiconductor layer 3111 and the second semiconductor layer 3112 and the second III-V compound stack 312 including the third semiconductor layer 3213 and the fourth semiconductor layer 3114 are epitaxially formed on the common growth substrate 330 and are disposed above the common heater 340. The first 2DEG channel 311C formed at the interface of the first semiconductor layer 3111 and the second semiconductor layer 3112 of a sensing element 310. The second 2DEG channel 312C formed at the interface of the third semiconductor layer 3213 and the fourth semiconductor layer 3214 of the reference element 320. The first 2DEG channel 311C and the second 2DEG channel 312C are separated by a trench TR3. A passivation layer 314 covers the lateral surface of electrodes 312 and 313 and exposes a first sensing area 311A. A passivation layer 324 covers the lateral surface of the electrodes 322 and 323 and fully covers a second sensing area 321A. A lowest end of the trench TR3 is lower than a bottom surface of the second semiconductor layer 3112 and a bottom surface of the fourth semiconductor layer 3214. The lowest end of the trench TR3 is higher than a bottom surface of the first semiconductor layer 3111 and a bottom surface of the third semiconductor layer 3213. For example, a depth D of the trench TR3 which is between the top surface of the second semiconductor layer 3112/fourth semiconductor layer 3214 and the lowest end of the trench TR3 ranges from 35 nm to 235 nm. The first III-V compound stack 311 has a thickness similar/substantially equivalent to the second III-V compound stack 321. The depth D is less than the thickness of the first III-V compound stack 311/the second III-V compound stack 321. The second semiconductor layer 3112/fourth semiconductor layer 3214 has a thickness which is less than the depth D.

The second semiconductor layer 3112 and the fourth semiconductor layer 3214 are separated by the trench TR3 formed between the sensing element 310 and the reference element 320. A first semiconductor layer 3111 and a third semiconductor layer 3213, however, are remained intact and has a portion directly connected to each other. In this embodiment, the sensing element 310 and the reference element 320 are manufactured on the common growth substrate 330 and located nearly, so the influence of the background noise on the sensing element 310 and the reference element 320 are the similar.

The sensing device 300, as shown in FIG. 4, has no or less current interference occurred between the first 2DEG channel 311C and the second 2DEG channel 312C, since the first 2DEG channel 311C and the second 2DEG channel 312C are separated by the trench TR3.

Figure 5A:
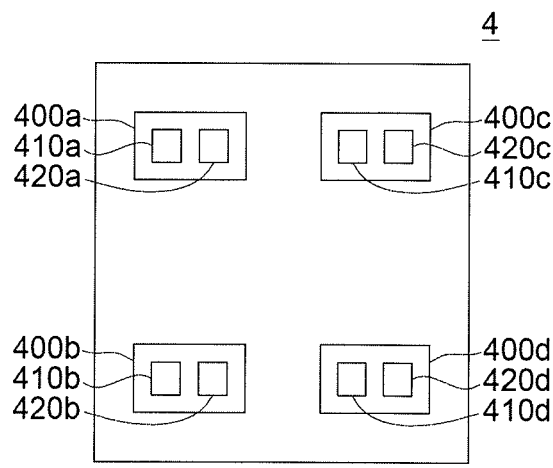
FIG. 5A shows a sensing apparatus according to one embodiment.

Please refer to FIG. 5A, which shows a sensing apparatus 4 according to one embodiment. The sensing apparatus 4 includes a plurality of sensing devices 400a, 400b, 400c, 400d, each of which is sensitive to a specific target substance. The sensing devices 400a, 400b, 400c, 400d can be integrated into one system, such as mounted on a common circuit board, or packaged into one unit. The sensing device 400a has a sensing element 410a and a reference element 420a. The sensing device 400b has a sensing element 410b and a reference element 420b. The sensing device 400c has a sensing element 410c and a reference element 420c. The sensing device 400d has a sensing element 410d and a reference element 420d which is used for removing the background noise. The detailed structure of those sensing elements 410a, 410b, 410c, 410d and those reference elements 420a, 420b, 420c, 420d can refer to the drawings and paragraphs directed to FIG. 1A and FIG. 4. Taking the sensing device 400a as an example, the sensing element 410a includes a first III-V compound stack (not shown), and the reference element 420a includes a second III-V compound stack (not shown). A first 2DEG channel (not shown) formed in the first III-V compound stack is physically separated from a second 2DEG channel (not shown) formed in the second III-V compound stack. The reference elements 420a and the sensing element 410a are manufactured on the common growth substrate and the common heater, so the influence of the background noise on the reference element 420a and the sensing element 410a are similar. The sensing devices 400b, 400c, 400d are similar to the sensing device 400a and the similarities will not repeat here.

As shown in FIG. 5A, the plurality of sensing devices 400a, 400b, 400c, 400d have different functionalization layers (not shown) for sensing different target substances. For example, the sensing device 400a is sensitive to $H_2$, the sensing device 400b is sensitive to $CH_4$, the sensing device 400c is sensitive to $NH_3$, and the sensing device 400d is sensitive to CO. In other embodiment, the sensing devices 400a-400d can sense other substances selecting from $SO_x$, NO, $NO_2$, $CO_2$, CH4 group, acetone, alcohol . . . etc. Base on above, the sensing apparatus 4 can be used to sensing different target substances.

Figure 5B:
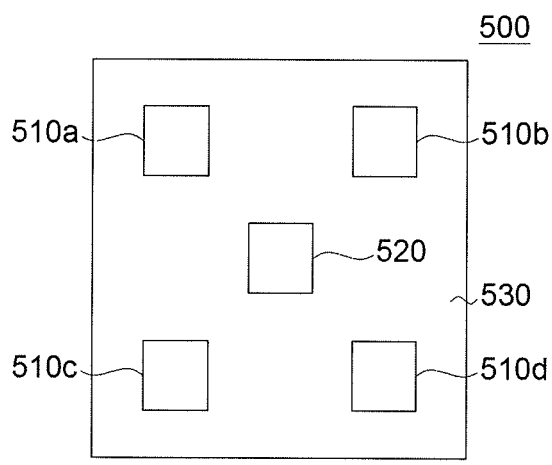
FIG. 5B shows a sensing device according to another embodiment.

Please refer to FIG. 5B, which shows a sensing device 500 according to another embodiment. The sensing device 500 includes one reference element 520 and a plurality of sensing elements 510a, 510b, 510c, 510d. Different sensing elements 510a, 510b, 510c, 510d have different functionalization layers (not shown) for detecting different target substances.

The sensing device 500 shown in FIG. 5B, has same or similar epitaxial or semiconductor structures which can refer to the drawing and paragraphs of FIG. 1A and FIG. 4, but has different functionalization layers on every sensing elements 510a, 510b, 510c, 510d for sensing different target substances.

The sensing elements 510a, 510b, 510c, 510d share the common reference element 520 for removing their background noises and the base line shifts. The reference element 520 can be arranged in a geometric center of an area virtually formed by the sensing elements 510a, 510b, 510c, 510d. In one embodiment, the reference element 520 is separated from every sensing elements 510a, 510b, 510c, 510d by similar/substantially equivalent distances.

In one embodiment, the sensing elements 510a, 510n, 510c, 510d and the reference element 520 are epitaxially formed on a common growth substrate 530, and have identical or very similar layer structures.

Figure 5C:
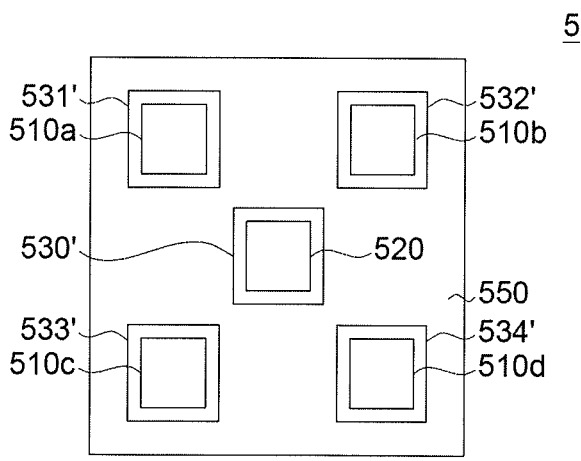
FIG. 5C shows a sensing apparatus according to another embodiment.

Please refer to FIG. 5C, which shows a sensing apparatus 5 according to another embodiment. The sensing elements 510a, 510b, 510c, 510d may be manufactured on the substrates 531', 532', 533', 534' which are separated and mounted on the sub-mount 550. The reference elements 520 may be manufactured on the substrates 530' which is separated from substrate 531', 532', 533', 534' and mounted on the sub-mount 550. The sensing elements 510a, 510b, 510c, 510d and the reference element 520 can have the same materials with the same doping concentration, and are grown on the same wafer in the same epitaxial growth condition. Therefore, even if the reference element 520 is separated from the sensing elements 510a, 510b, 510c, 510d, the sensing elements 510a, 510b, 510c, 510d and the reference element 520 have similar electrical characteristics.

Figure 6A:
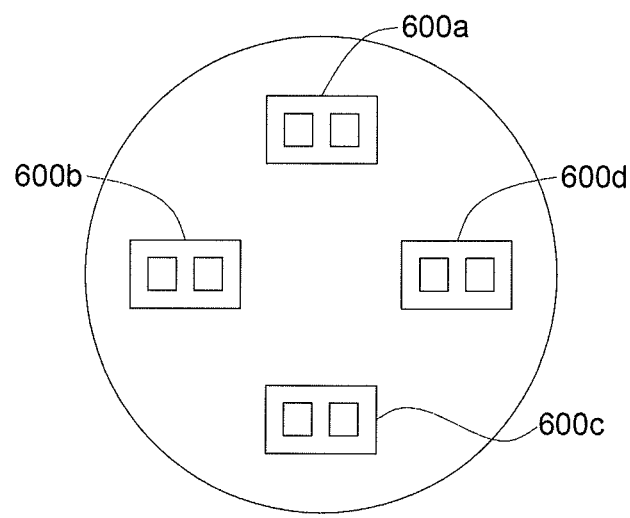
FIG. 6A shows a sensing apparatus according to another embodiment.

Please refer to FIG. 6A, which shows a sensing apparatus 6 according to another embodiment. The sensing apparatus 6 has a plurality of sensing devices 600a, 600b, 600c, 600d. The sensing devices 600a, 600b, 600c, 600d are sensitive to the same target substance. The sensing devices 600a, 600b, 600c, 600d can be integrated into one system, such as mounted one a common circuit board, or packaged into one unit. The sensing devices 600a, 600b, 600c, 600d are arranged in different positions for distinguishing the coming direction of the target substance.

Each of sensing devices 600a, 600b, 600c, 600d has the similar structure which can refer to the drawings and paragraphs of FIG. 1A and FIG. 4. For example, the sensing device 600a is arrange at the North (upper side) of the sensing apparatus 6, the sensing device 600b is arranged at the West (left side) of the sensing apparatus 6, the sensing device 600c is arranged at the South (bottom side) of the sensing apparatus 6, and the sensing device 600d is arranged at the East (right side) of the sensing apparatus 6.

Figure 6B:
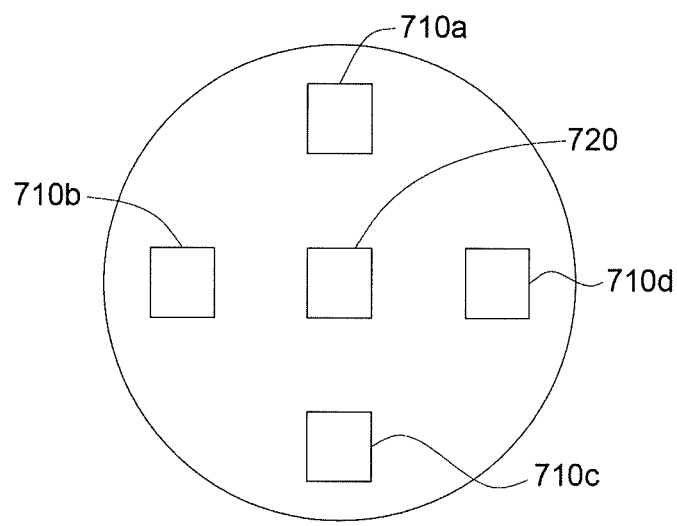
FIG. 6B shows a sensing device according to another embodiment.

Please refer to FIG. 6B, which shows a sensing device 700 according to another embodiment. The sensing device 700 includes one reference element 720 and a plurality of sensing elements 710*a*, 710*b*, 710*c*, 710*d*. The sensing elements 710*a*, 710*b*, 710*c*, 710*d* are arranged in different positions for distinguishing the coming direction of the target substance. The sensing device 700 shown as FIG. 6B has the similar structure which can refer to the drawings and paragraphs of FIG. 1A and FIG. 4.

Figure 6C:
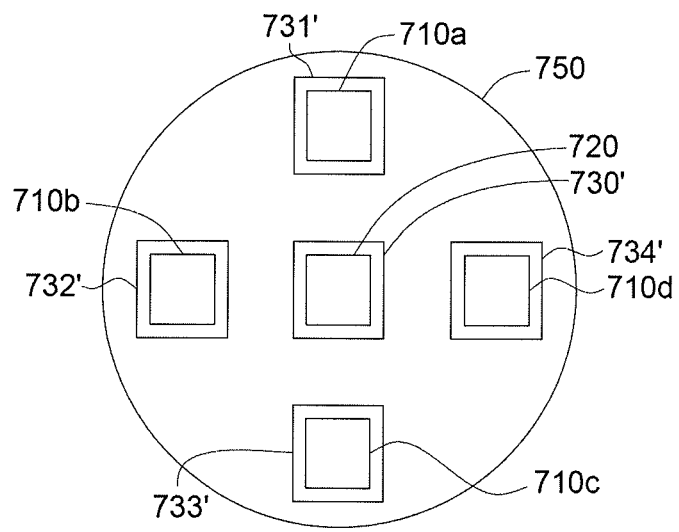
FIG. 6C shows a sensing apparatus according to another embodiment.

The sensing elements 710*a*, 710*b*, 710*c*, 710*d* share a common reference element 720 for removing their background noises and the base line shifts. The reference element 720 can be arranged in a geometric center of an area virtually formed by the sensing elements 710*a*. 710*b*, 710*c*, 710*d*. In one embodiment, the reference element 720 is separated from every sensing elements 710*a*, 710*b*, 710*c*, 710*d* by similar/substantially equivalent distances. Please refer to FIG. 6C, which shows a sensing apparatus 7 according to another embodiment. The sensing elements 710*a*. 710*b*, 710*c*, 710*d* may be manufactured on the substrates 731', 732', 733', 734' which are separated and mounted on the sub-mount 750. The reference elements 720 may be manufactured on the substrates 730' which is separated from substrate 731', 732', 733', 734' and mounted on the sub-mount 750. The sensing elements 710*a*, 710*b*, 710*c*, 710*d* and the reference element 720 can have the same materials with the same doping concentration, and are grown on the same wafer in the same epitaxial growth condition. Therefore, even if the reference element 720 is separated from the sensing elements 710*a*, 710*b*, 710*c*, 710*d*, the sensing elements 710*a*, 710*b*, 710*c*, 710*d* and the reference element 720 have similar electrical characteristics.

Figure 7:
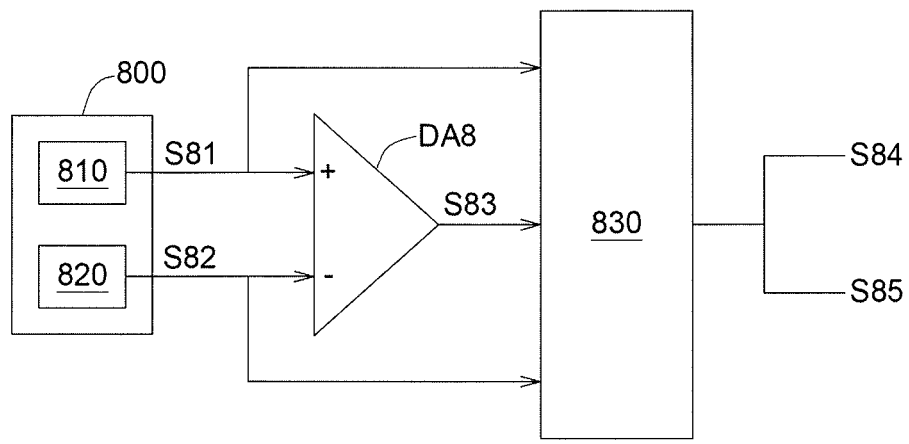
FIG. 7 shows a sensing system according to another embodiment.

Please refer to FIG. 7, which shows a sensing system 8 according to another embodiment. In this embodiment, the sensing system 8 can detect whether the reference element 820 is failed or not. The sensing system 8 includes a sensing device 800, a differential amplifier DA8 and a controlling circuit 830. The sensing device 800 has a structure which can refer to the drawings and paragraphs of FIGS. 1A, 3A, 3B and 4. The sensing device 800 includes a sensing element 810 and a reference element 820. A first signal S81 is outputted from the sensing element 810, and a second signal S82 is outputted from the reference element 820. The controlling circuit 830 has an output signal S84 which is related to the concentration of substance target, and an indicating signal S85 which shows the sensing device 800 (or the reference element 820) is well worked or not. The controlling circuit 830 receives a first signal S81 outputted from the sensing element 810, a second signal S82 outputted from the reference element 820, and a calibrating signal S83 outputted from the differential amplifier DA8. If the controlling circuit 830 determines the reference element 820 is well worked, the output signal S84 of the controlling circuit 830 is outputted. When the reference element 820 is failed, for example the passivation layer is broken, the second signal S82 outputted from the reference element 820 is varied according to the amount of the target substance and may be similar to the first signal S81. Hence, the calibrating signal S83 outputs the wrong signal, for example close to zero, and not corresponding to the target substance. In this case, the controlling circuit 830 can determine the reference element 820 is failed, then the output signal S84 of the controlling circuit 830 outputs the first signal S81 instead of the calibrating signal S83, and the indicating signal S85 outputs an alarm signal to show the sensing device 800 needed to be repaired or replaced.

In one embodiment, the controlling circuit 830 monitors a change of a second signal S82 outputted from the reference element 820. In the normal situation, the second signal S82 is varied along the background noise, such as base line shift, the aging of heater, and the change of the second signal S82 is not too large. If the change of the second signal S82 is larger than a predetermined level, such as 10%, then it is deem that the reference element 820 is failed, for example the passivation layer of the reference element 820 is broken, the second signal S82 may be changed seriously due to the existence of the target substance. So, the change of the second signal S82 may be larger than 10%. In one embodiment, the controlling circuit 830 can record the second signal S82 outputted from the reference element 820 in each time interval which is preferably larger than a response time of the reference element 820 and calculated the difference of two of S82 measured continuously.

In another embodiment, the controlling circuit 830 can determine if the reference element 820 is malfunctioned according to the difference between the calibrating signal S83 and the first signal S81. When the calibrating signal S83 is close to zero and the first signal S81 is much larger than zero such that the reference element 820 is failed, the output signal S84 of the controlling circuit 830 outputs the first signal S81 instead of the calibrating signal S83, and the indicating signal S85 output an alarm signal to show the sensing device 800 needed to be repaired or replaced.

Figure 8:
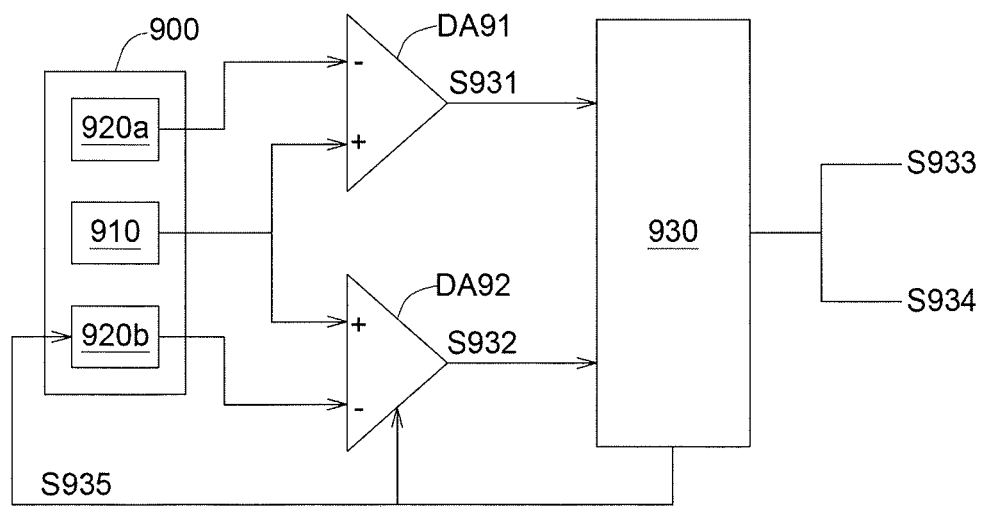
FIG. 8 shows a sensing system according to another embodiment.

Please refer to FIG. 8, which shows a sensing system 9 according to another embodiment. The sensing system 9 includes a sensing device 900, a master differential amplifier DA91, a slave differential amplifier DA92, and a controlling circuit 930. The sensing device 900 has a structure which can refer to the drawings and paragraphs of FIGS. 1A, 3A, 3B and 4. The sensing device 900 includes a sensing element 910, a master reference element 920*a*, and a slave reference element 920*b*. The sensing element 910 is electrically connected to the master differential amplifier DA91 and the slave differential amplifier DA92. The master reference element 920*a* is electrically connected to the master differential amplifiers DA91. The slave reference element 920*b* is electrically connected to the slave differential amplifiers DA92. The controlling circuit 930 has an output signal S933 which is related to the concentration of substance target, and an indicating signal S934 which shows the sensing device 900 is well worked or not.

In this embodiment, the master reference element 920*a* operates with the sensing element 910 under a normal mode, and the slave reference element 920*b* operates with the sensing element 910 under a checking mode. The checking mode is operated periodically. In other words, the slave differential amplifier DA92 and the slave reference element 920*b* do not operate all the time and are turned on periodically by a control signal S935 according to the setting in the control circuit 930 or a manual operation. In the checking mode, the master reference element 920*a* will be investigated to determine if it is well-functioned. The slave reference element 920*b* can also provide a backup function while the master reference element 920*a* is failed. A master calibrating signal S931 is outputted from the master differential amplifier DA91 and shows the signal which is came from the sensing element 910 by deducting the signal from the master reference element 920*a*. A slave calibrating signal S932 is outputted from the slave differential amplifier DA92 and shows the signal which is came from the sensing element 910 by deducting the signal from the slave reference element 920*b*. If the master reference element 920*a* is successfully operated, the master calibrating signal S931 and the slave calibrating signal S932 are similar. The controlling circuit 930 monitors a difference of two calibrating signals S931, S932 in the checking mode. If the difference of the two calibrating signals S931, S932 is larger than a predetermined difference, such as 10%, the master reference element 920*a* is failed. When the controlling circuit 930 determines that the master reference element 920*a* is well worked, the output signal S933 of the controlling circuit 930 outputs the master calibrating signal S931. When the controlling circuit 930 determines that the master reference element 920*a* is failed, the output signal S933 of the controlling circuit 930 outputs the slave calibrating signal S932 instead of the master calibrating signal S931. Moreover, the indicating signal S934 outputs an alarm signal to show the sensing device 900 is not normal. Correspondingly, the slave reference element 920*b* is used to replace the master reference element 920*a* to make the sensing device 900 well-functioned.

Figure 9:
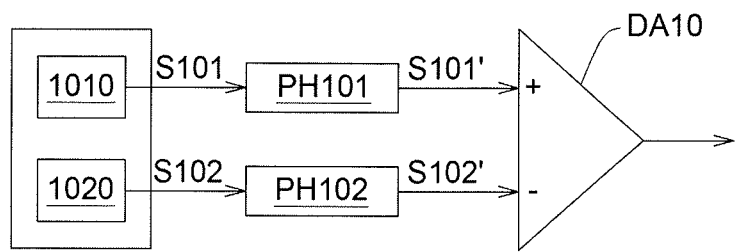
FIG. 9 shows a sensing system according to another embodiment.

Please refer to FIG. 9, which shows a sensing system 10 according to another embodiment. The sensing system 10 includes two photo-couplers PH101, PH102. A first signal S101 outputted from a sensing element 1010 and a second signal S102 outputted from a reference element 1020 are given to the two photo-couplers PH101, PH102, respectively. In the usual, a resistor is used to connect to the sensing element (reference element) in parallel for converting a current signal to a voltage signal. However, the resistor will also affect the current signal, and then the converted voltage signal is also affected by the resistor. The photo-couplers PH101, PH102 can convert a current signal to a voltage signal without affecting the current signal. Output signals S101', S102' of the photo-couplers PH101, PH102 are inputted into a differential amplifier DA10. The schematic of FIG. 9 can be implemented on the master differential amplifier DA91, the slave differential amplifier DA92, the differential amplifier DA8 shown in FIG. 8 and FIG. 7.

Figure 10A:
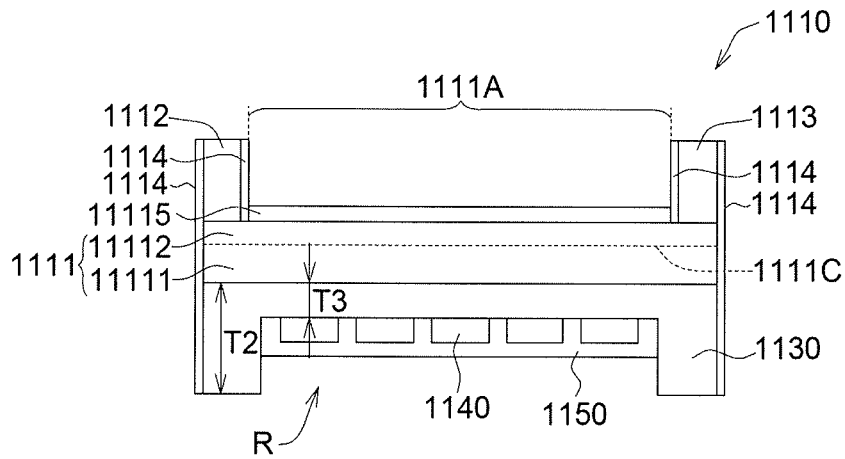
FIGS. 10A-10C show a sensing element according to one embodiment.
Figures 10B, 10C:
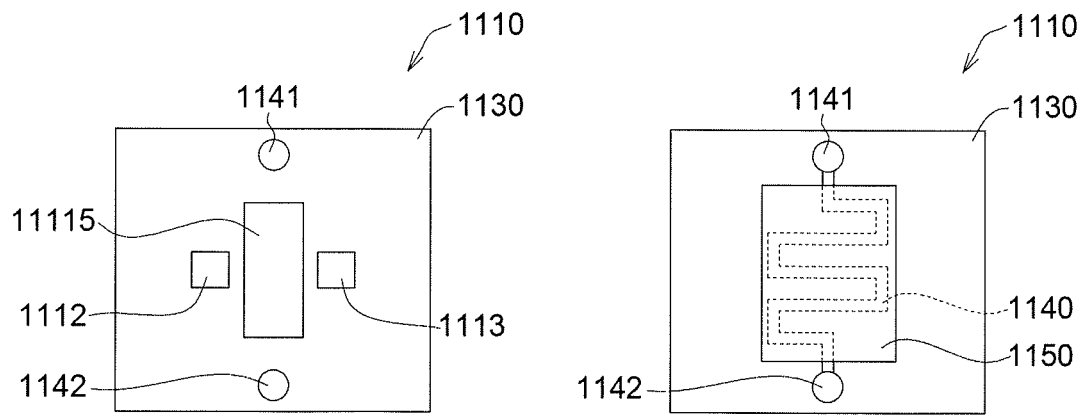

Please refer to FIGS. 10A-10C, which show a sensing element 1110 according to one embodiment. FIG. 10A is a cross sectional view of the sensing element 1110 with a heater 1140 according to another embodiment. The heater 1140 is disposed on a backside of the sensing element 1110. FIG. 10B is a top view of the sensing element 1110. FIG. 10C is a bottom view of the sensing element 1110.

The sensing element 1110 includes a III-V compound stack 1111 formed on the substrate 1130. The III-V compound stack 1111 includes the first semiconductor layer 11111, the second semiconductor layer 11112, and a 2DEG channel 1111C can be formed at the interface of the first semiconductor layer 11111 and the second semiconductor layer 11112. Two electrodes 1112, 1113 formed on the III-V compound stack 1111, and a sensing area 1111A located between the electrode 1112 and the electrode 1113. Optionally, a functionalization layer 11115 disposed on the sensing area 1111A for enhancing the selectivity and sensitivity of detecting the target substance. The passivation layer 1114 covers the lateral surface of the electrodes 1112, 1113 and the III-V compound stack, and exposes the first sensing area 1111A. The details of the III-V compound stack, the electrode, the passivation layer, and the sensing area can refer to aforementioned descriptions related to FIG. 1A. The substrate 1130 shown in FIG. 10A has a recess R positioned under the sensing region 1111A and the functionalization layer 11115. Hence, the substrate 1130 has a central portion and a periphery region. The thickness of the central portion of the substrate 1130 is thinner than that of the periphery portion of the substrate 1130. A heater 1140 is located on the recess R. In details, the heater is located on the central portion of the substrate 1130. The thinner thickness of the central portion of the substrate 1130 is good for heat conduction from the heater 1140 to the functionalization layer 11115. Hence, the heater 1140 does not need to operate at higher operating current, and the sensing region 1111A can reach the estimated temperature due to less heat leaking to the substrate 1130. The power consumption of the heater 1140 can be saved.

In one embodiment, the thickness T2 of the substrate 1130 at the periphery region is less than 300 um, and the thickness T3 of the substrate 1130 at the central region is 25-50 um.

As shown in FIG. 10C, the heater 1140 has a meandering shape for increasing the heating area throughout the sensing region 1111A and improving the temperature uniformity. The heater 1140 is not limited to the meandering shape. Any shape which is beneficial to uniformly heat the sensing region 1111A can be applied to the heater 1140.

A passivation layer 1150 placed below the heater 1140 can prevent the heat dissipation downward, and force heat moving to the sensing region 1111A. The heater 1140 is applied a voltage to generate heat source from the conducting pads 1141, 1142.

The FIG. 108 shows the sensing element 1110 only, however, the same design can applied to the reference element (not shown). In one embodiment, the sensing element 1110 and reference element (not shown) share the common growth substrate 1130 and the heater 1140.

Figure 11A:
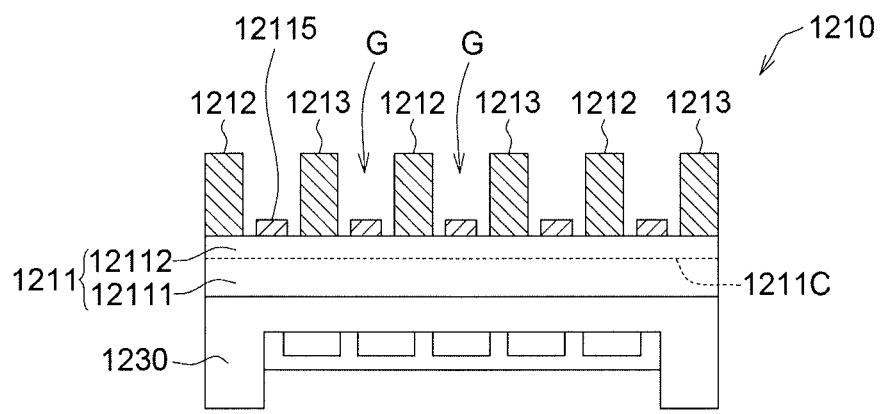
FIGS. 11A-11B show a sensing element according to another embodiment.
Figure 11B:
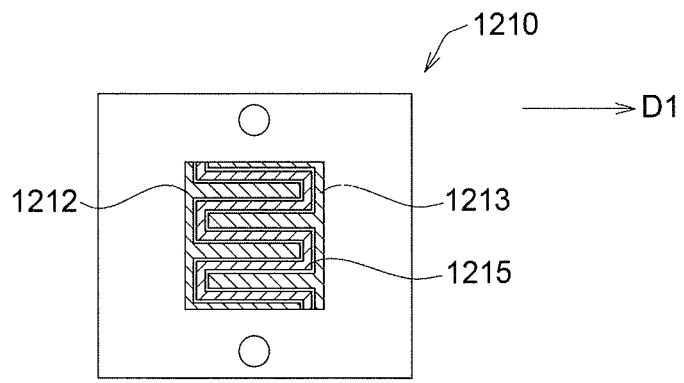

Please refer to FIGS. 11A-11B, which show a sensing element 1210 according to another embodiment. FIG. 11A is a cross sectional view of the sensing element 1210. FIG. 11B is a top view of the sensing element 1210. The sensing element 1210 includes a III-V compound stack 1211 formed on the substrate 1230. The III-V compound stack 1211 includes the first semiconductor layer 12111, the second semiconductor layer 12112, and a 2DEG channel 1211C can be formed at the interface of the first semiconductor layer 12111 and the second semiconductor layer 12112. Two interdigitated electrodes (IDE) 1212, 1213 form a gap G, the gap G defines the area which is the sensing region. As shown in FIG. 11B, the gap G has a meandering shape. Optionally, the functionalization layer 12115 is formed in the gap G, as shown in FIG. 11A and/or FIG. 11B. The current spreading of the sensing element 1210 with the interdigitated electrodes 1212, 1213 can be improved such that the sensitivity also can be improved.

Figure 12:
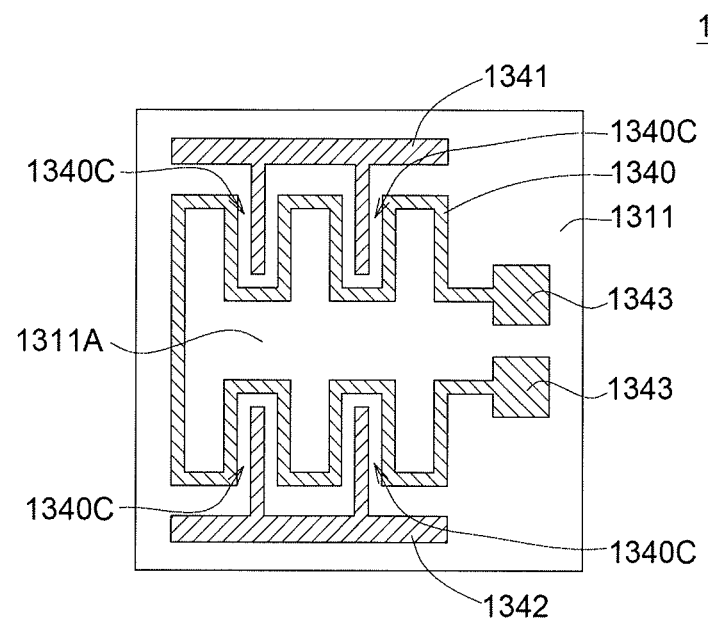
FIG. 12 shows a top view of a sensing element according to another embodiment.

Please refer to FIG. 12, which shows a top view of a sensing element 1310 according to another embodiment. The sensing element 1310 includes a III-V compound stack 1311 formed on the substrate (not shown), two interdigitated electrodes (IDE) 1341, 1342 disposed on the III-V compound stack 1311, and a heater 1340 also disposed on the same side of the III-V compound stack 1311 as the two interdigitated electrodes (IDE) 1341, 1342. The related descriptions of the III-V compound stack 1311 and the substrate can be referred to the paragraphs of FIG. 1A. The heater 1340 is formed along the contour of the two interdigitated electrodes (IDE) 1341, 1342 with curve shaped and forms several concave portions 1340C. The heater 1340 is applied a voltage from the conducting pads 1343 to generate heat source. The heater 1340 and two electrodes 1341, 1342 are located at the same side of the III-V compound stack. In this embodiment, the heater 1340 has a meandering shape with a plurality of concave portions 1340C. The electrodes 1341, 1342 are extended into the concave portions 1340C. A sensing area 1311A is located on the top surface of the III-V compound stack and surrounded by the heater 1340. The heater 1340 and the sensing area 1311A are located at the same side, so the transmission path of the heat is short. The heater 1340 does not need to operate at higher operating current, and the sensing area 1311A can reach the estimated temperature due to less heat leaking to the substrate. The power consumption of the heater 1340 can be saved.

Figure 13:
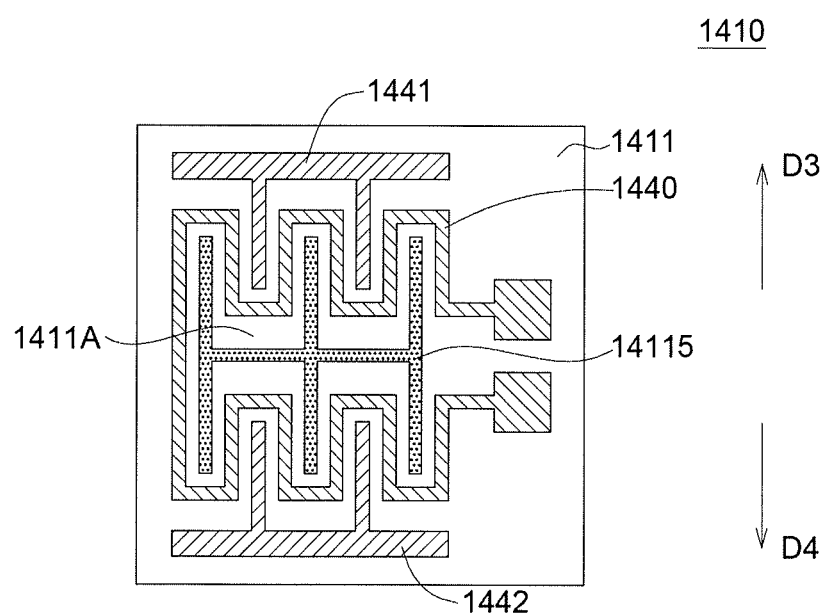
FIG. 13 shows a top view of a sensing element according to another embodiment.

Please refer to FIG. 13, which show a top view of a sensing element 1410 according to another embodiment. The structure of the sensing element 1410 is similar to the sensing element 1310. The sensing element 1410 includes a III-V compound stack 1411 formed on the substrate (not shown), two interdigitated electrodes (IDE) 1441, 1442 disposed on the III-V compound stack 1411, a heater 1440 and a functionalization layer 14115 disposed on the same side of the III-V compound stack 1411 as the two interdigitated electrodes (IDE) 1441, 1442. The related descriptions of the III-V compound stack, the substrate, the heater can be referred to the paragraphs of FIG. 12. A sensing area 1411A is located on the top surface of the III-V compound stack and surrounded by the heater 1440. The functionalization layer 14115 is disposed on the sensing area 1411A so that the heater 1440 and the functionalization layer 14115 are located at the same side. Hence, the transmission path of the heat from the heater 1440 to the functionalization layer 14115 is short. The heater 1440 does not need to operate at higher operating current, and the functionalization layer 14115 can reach the estimated temperature due to less heat leaking to the substrate. The power consumption of the heater 1440 can be saved. The functionalization layer 14115 is extended along directions D3, D4 and the heater 1440 surrounds the functionalization layer 14115.

According to the embodiments described above, the background noise sensed, and/or the base line shift can be determined by the reference element. The sensing element and the reference element have identical or very similar background noises, or the base line shifts. Only the sensing element is exposed to response to existence of the target substance. The calibrating signal is a signal purely directed to the concentration of the target substance.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A sensing device, comprising:
a substrate made of an insulating material;
a first III-V compound stack in direct contact with the substrate and comprising a first semiconductor layer, and a second semiconductor layer formed on the first semiconductor layer; and
a second III-V compound stack in direct contact with the substrate, and comprising a third semiconductor layer, a fourth semiconductor layer formed on the third semiconductor layer,
wherein the first III-V compound stack is separated from the second III-V compound stack by a trench, the trench has a lowest end which is higher than bottom surfaces of the first semiconductor layer and the third semiconductor layer.

2. The sensing device according to claim 1, wherein the trench has a depth which is measured from a top surface of the second semiconductor layer to the lowest end and has a range from 35 nm to 235 nm.

3. The sensing device according to claim 2, wherein the first III-V compound stack has a thickness, and the depth is less than the thickness.

4. The sensing device according to claim 1, further comprising a sub-mount, wherein the first III-V compound stack and the second III-V compound stack are disposed on the sub-mount.

5. The sensing device according to claim 1, wherein the first semiconductor layer has a portion connected to the third semiconductor layer.

6. The sensing device according to claim 1, wherein the second semiconductor layer is fully separated from the fourth semiconductor layer.

* * * * *